(12) United States Patent
Jung et al.

(10) Patent No.: US 12,431,347 B2
(45) Date of Patent: Sep. 30, 2025

(54) METHOD FOR TREATING SUBSTRATE

(71) Applicant: SEMES CO., LTD., Chungcheongnam-do (KR)

(72) Inventors: Jinwoo Jung, Seoul (KR); Young Hun Lee, Cheonan-si (KR); Yong Hee Lee, Cheonan-si (KR); Eui Sang Lim, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 443 days.

(21) Appl. No.: 17/867,813

(22) Filed: Jul. 19, 2022

(65) Prior Publication Data
US 2022/0351968 A1 Nov. 3, 2022

Related U.S. Application Data

(62) Division of application No. 16/516,905, filed on Jul. 19, 2019, now abandoned.

(30) Foreign Application Priority Data

Jul. 23, 2018 (KR) .................. 10-2018-0085561

(51) Int. Cl.
*H01L 21/00* (2006.01)
*F26B 3/02* (2006.01)
(Continued)

(52) U.S. Cl.
CPC .......... *H01L 21/02101* (2013.01); *F26B 3/02* (2013.01); *F26B 21/14* (2013.01); *H01L 21/67034* (2013.01); *H01L 21/67051* (2013.01)

(58) Field of Classification Search
CPC ......... H01L 21/02101; H01L 21/67034; H01L 21/67051; H01L 21/67017;
(Continued)

(56) References Cited

U.S. PATENT DOCUMENTS 5,482,211 A * 1/1996 Chao .................. B05D 1/025
239/135
2013/0000144 A1 1/2013 Choi et al.
(Continued)

FOREIGN PATENT DOCUMENTS

CN 102856162 A 1/2013
CN 104681425 A 6/2015
(Continued)

OTHER PUBLICATIONS

China Patent Office, Notice of Allowance issed on May 23, 2023.
China Patent Office, Office action issued on Jan. 13, 2023.

*Primary Examiner* — John P McCormack
(74) *Attorney, Agent, or Firm* — Li & Cai Intellectual Property (USA) Office (57) ABSTRACT

A method for treating a substrate is provided. The method includes the following steps: performing a process of treating the substrate by dispensing a supercritical fluid onto the substrate. A treating fluid flows through a treating fluid supplying regulator regulating an amount of the treating fluid before dispensed onto the substrate. The treating fluid is heated to a set temperature or more by a first heater before passing through the treating fluid supplying regulator, and the treating fluid is heated by a second heater when the treating fluid is passed through the treating fluid supplying regulator. The temperature of the treating fluid is lowered in rear region of the treating fluid supplying regulator. The set temperature is a temperature that allows the lowered temperature to be maintained at a critical temperature or more.

6 Claims, 7 Drawing Sheets

①Front orifice region  ②Orifice region  ③Rear orifice region (51) Int. Cl.
*F26B 21/14* (2006.01)
*H01L 21/02* (2006.01)
*H01L 21/67* (2006.01)

(58) Field of Classification Search
CPC ......... H01L 21/67028; H01L 21/67103; H01L 21/6719; H01L 21/67109; H01L 21/6704; H01L 21/02041; H01L 21/324; H01L 21/6715; H01L 21/67248; F26B 3/02; F26B 21/14
USPC .......................................................... 34/405
See application file for complete search history.

(56) References Cited

U.S. PATENT DOCUMENTS

| | | |
|---|---|---|
| 2013/0081297 A1 | 4/2013 | Nakashima |
| 2013/0333726 A1 | 12/2013 | Goshi et al. |
| 2014/0290092 A1 | 10/2014 | Jung et al. |
| 2015/0155158 A1* | 6/2015 | Kim .................. H01L 21/67017 34/82 |
| 2018/0158676 A1 | 6/2018 | Kiyohara |

FOREIGN PATENT DOCUMENTS

| | | |
|---|---|---|
| CN | 107437518 A | 12/2017 |
| JP | 2012023102 A | 2/2012 |
| KR | 20130134997 A | 12/2013 |
| KR | 20150062908 A | 6/2015 |

\* cited by examiner

① Front orifice region  ② Orifice region  ③ Rear orifice region

ABSTRACT

METHOD FOR TREATING SUBSTRATE

CROSS-REFERENCE TO RELATED APPLICATIONS

This Application is a Divisional application Ser. No. 16/516,905, filed on Jul. 19, 2019. The application Ser. No. 16/516,905 is claimed for priority under 35 U.S.C. § 119 that is made to Korean Patent Application No. 10-2018-0085561 filed on 23 Jul. 2018, in the Korean Intellectual Property Office, the entire contents of which are hereby incorporated by reference.

BACKGROUND

Embodiments of the inventive concept described herein relate to an apparatus and method for treating a substrate, and more particularly, relate to an apparatus and method for treating a substrate with a liquid dispensed onto the substrate and then removing the liquid.

Semiconductor processes comprise a process of cleaning a thin film, foreign matter, particles, or the like on a substrate. The cleaning process is performed by placing the substrate on a spin head such that a patterned surface is directed upward or downward, dispensing a treating liquid onto the substrate while rotating the spin head, and thereafter drying the substrate.

In recent years, a supercritical fluid has been used in a process of cleaning a substrate. For example, a liquid treating chamber for treating a substrate by dispensing a treating liquid onto a substrate and a high-pressure chamber for removing the treating liquid from the substrate by using a supercritical fluid after the performance of the liquid treating are provided, and the substrate completely treated in the liquid treating chamber is transferred into the high-pressure chamber by a transfer robot.

Figure 1:
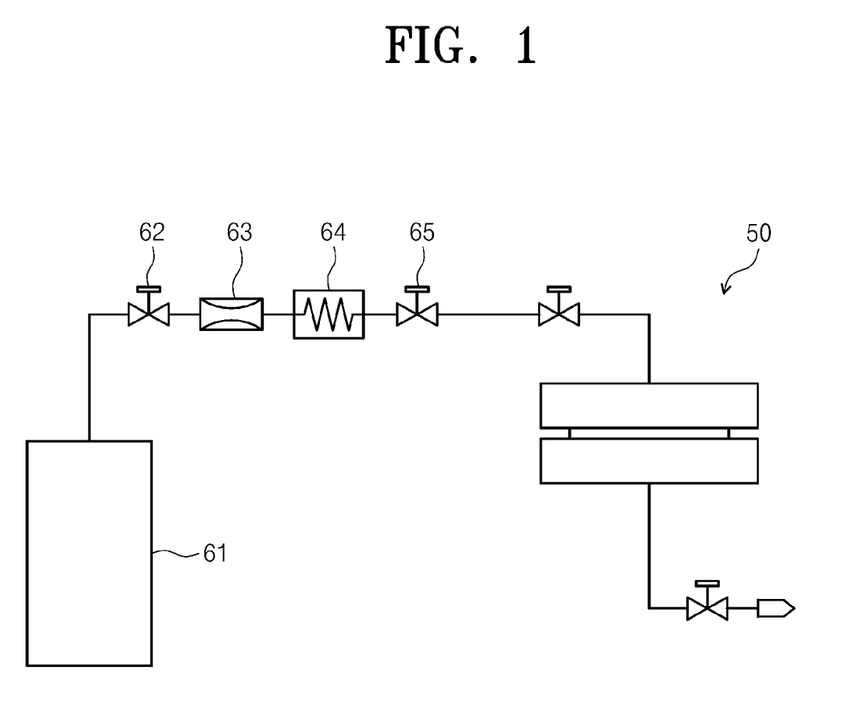
FIG. 1 is a schematic view illustrating a substrate treating apparatus in the related art.

FIG. 1 is a schematic view illustrating a substrate treating apparatus for cleaning a substrate by using a supercritical fluid in the related art. The supercritical fluid is stored in a fluid supply tank 61 and is supplied by opening a valve. An orifice 63 is provided in a supply line. The orifice 63 adjusts the supply of the supercritical fluid. A heater 64 is provided downstream of the orifice 63 to heat the supercritical fluid passing through the orifice 63. The heated supercritical fluid is supplied into a chamber 50. The supercritical fluid is adiabatically expanded after passing through the orifice 63, and therefore an unintended phase change may occur.

SUMMARY

Embodiments of the inventive concept provide a substrate treating apparatus and method for improving process efficiency when treating a substrate by using a supercritical fluid.

Furthermore, embodiments of the inventive concept provide a substrate treating apparatus and method for reducing particles on a substrate when treating the substrate by using a supercritical fluid.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate comprises a chamber having a processing space in which a process of treating the substrate is performed and a fluid supply unit that supplies a treating fluid into the chamber. The fluid supply unit comprises a supply line, at least one orifice provided in the supply line, and a first heater provided on the orifice or upstream of the orifice. The first heater heats the treating fluid passing through the orifice to a set temperature or more.

According to an embodiment, the treating fluid may be adiabatically expanded downstream of the orifice, and the set temperature may be a temperature that allows the temperature of the treating fluid adiabatically expanded after passing through the orifice to be maintained at a critical temperature or more.

According to an embodiment, the supply line may comprise an orifice region in which the orifice is provided, a front orifice region upstream of the orifice region, and a rear orifice region downstream of the orifice region. The treating fluid may form at least one turning point in a temperature-pressure phase diagram while sequentially passing through the front orifice region, the orifice region, and the rear orifice region. The turning point may be formed at a temperature higher than a critical temperature of the treating fluid.

According to an embodiment, the set temperature may be a temperature that allows the treating fluid passing through the orifice to change into a gaseous or supercritical state to experience two-phase or less phase change.

According to an embodiment, the apparatus may further comprise a second heater provided downstream of the orifice.

According to an embodiment, the treating fluid may be carbon dioxide.

According to an exemplary embodiment, a method for treating a substrate comprises performing a process of treating the substrate by dispensing a supercritical fluid onto the substrate. A treating fluid flows through an orifice before dispensed onto the substrate. The treating fluid is heated to a set temperature or more before passing through the orifice.

According to an embodiment, the temperature of the treating fluid may be lowered downstream of the orifice, and the set temperature may be a temperature that allows the lowered temperature to be maintained at a critical temperature or more.

According to an embodiment, a supply line that supplies the treating fluid may comprise an orifice region in which the orifice is provided, a front orifice region upstream of the orifice region, and a rear orifice region downstream of the orifice region. The treating fluid may form at least one turning point in a temperature-pressure phase diagram while sequentially passing through the front orifice region, the orifice region, and the rear orifice region. The turning point may be formed at a temperature higher than a critical temperature of the treating fluid.

According to an embodiment, the process may be a process of drying the substrate.

According to an embodiment, the treating fluid may be carbon dioxide.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that the inventive concept will be thorough and complete, and will fully convey the scope of the inventive concept to those skilled in the art. In the drawings, the dimensions of components are exaggerated for clarity of illustration.

Figure 2:
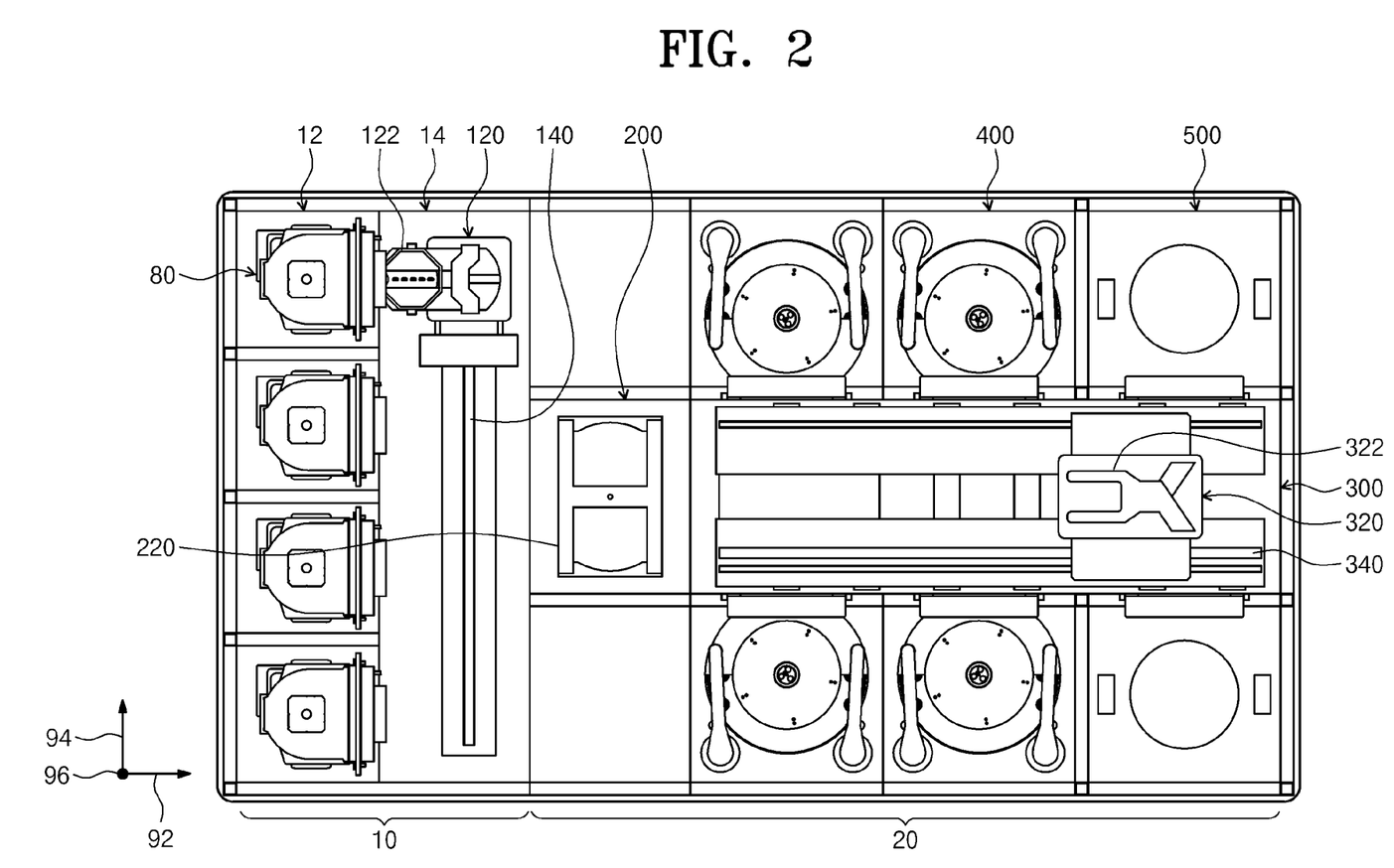
FIG. 2 is a schematic plan view illustrating a substrate treating apparatus according to an embodiment of the inventive concept.

FIG. 2 is a schematic plan view illustrating a substrate treating apparatus according to an embodiment of the inventive concept.

Referring to FIG. 2, the substrate treating apparatus comprises an index module 10, a process module 20, and a controller 30. According to an embodiment, the index module 10 and the process module 20 are arranged along one direction. Hereinafter, the direction in which the index module 10 and the process module 20 are arranged is referred to as a first direction 92, a direction perpendicular to the first direction 92 when viewed from above is referred to as a second direction 94, and a direction perpendicular to both the first direction 92 and the second direction 94 is referred to as a third direction 96.

The index module 10 transfers substrates W from carriers 80 having the substrates W received therein to the process module 20 and places, in the carriers 80, the substrates W completely treated in the process module 20. The lengthwise direction of the index module 10 is parallel to the second direction 94. The index module 10 has a plurality of load ports 12 and an index frame 14. The load ports 12 are located on the opposite side to the process module 20 with respect to the index frame 14. The carriers 80 having the substrates W received therein are placed on the load ports 12. The plurality of load ports 12 may be arranged along the second direction 94.

Airtight carriers such as front open unified pods (FOUPs) may be used as the carriers 80. The carriers 80 may be placed on the load ports 12 by a transfer unit (not illustrated) such as an overhead transfer, an overhead conveyor, or an automatic guided vehicle, or by an operator.

An index robot 120 is provided in the index frame 14. A guide rail 140, the lengthwise direction of which is parallel to the second direction 94, is provided in the index frame 14 and the index robot 120 is movable along the guide rail 140. The index robot 120 comprises a hand 122 on which a substrate W is placed, and the hand 122 is movable forward and backward, rotatable about an axis oriented in the third direction 96, and movable along the third direction 96. A plurality of hands 122 may be provided to be spaced apart from each other in the vertical direction. The hands 122 may independently move forward or backward.

The process module 20 comprises a buffer unit 200, a transfer chamber 300, liquid treating chambers 400, and high-pressure chambers 500. The buffer unit 200 provides a space in which substrates W to be loaded into the process module 20 and substrates W unloaded from the process module 20 temporarily stay. Each of the liquid treating chambers 400 performs a liquid treating process of treating a substrate W by dispensing a liquid onto the substrate W. Each of the high-pressure chambers 500 performs a drying process of removing the liquid remaining on the substrate W. The transfer chamber 300 transfers the substrate W between the buffer unit 200, the liquid treating chamber 400, and the high-pressure chamber 500.

The transfer chamber 300 may be arranged such that the lengthwise direction thereof is parallel to the first direction 92. The buffer unit 200 may be disposed between the index module 10 and the transfer chamber 300. The liquid treating chambers 400 and the high-pressure chambers 500 may be disposed on opposite sides of the transfer chamber 300. The liquid treating chambers 400 and the transfer chamber 300 may be arranged along the second direction 94. The high-pressure chambers 500 and the transfer chamber 300 may be arranged along the second direction 94. The buffer unit 200 may be located at one end of the transfer chamber 300.

According to an embodiment, the liquid treating chambers 400 may be disposed on the opposite sides of the transfer chamber 300, and the high-pressure chambers 500 may be disposed on the opposite sides of the transfer chamber 300. The liquid treating chambers 400 may be disposed closer to the buffer unit 200 than the high-pressure chambers 500. On one side of the transfer chamber 300, the liquid treating chambers 400 may be arranged in an A×B array (A and B being natural numbers of 1 or larger) along the first direction 92 and the third direction 96. Furthermore, on the one side of the transfer chamber 300, the high-pressure chambers 500 may be arranged in a C×D array (C and D being natural numbers of 1 or larger) along the first direction 92 and the third direction 96. Alternatively, the liquid treating chambers 400 may be provided on only the one side of the transfer chamber 300, and the high-pressure chambers 500 may be provided on only the opposite side of the transfer chamber 300.

The transfer chamber 300 has a transfer robot 320. A guide rail 340, the lengthwise direction of which is parallel to the first direction 92, may be provided in the transfer chamber 300 and the transfer robot 320 is movable along the guide rail 340. The transfer robot 320 may comprise a hand 322 on which the substrate W is placed. The hand 322 is movable forward and backward, rotatable about an axis oriented in the third direction 96, and movable along the third direction 96. A plurality of hands 322 may be provided to be spaced apart from each other in the vertical direction. The hands 322 may independently move forward or backward.

The buffer unit 200 comprises a plurality of buffers 220 in which substrates W are placed. The buffers 220 may be spaced apart from each other along the third direction 96. The front face and the rear face of the buffer unit 200 are open. The front face is opposite the index module 10, and the rear face is opposite the transfer chamber 300. The index robot 120 may approach the buffer unit 200 through the front face of the buffer unit 200, and the transfer robot 320 may approach the buffer unit 200 through the rear face of the buffer unit 200.

Figure 3:
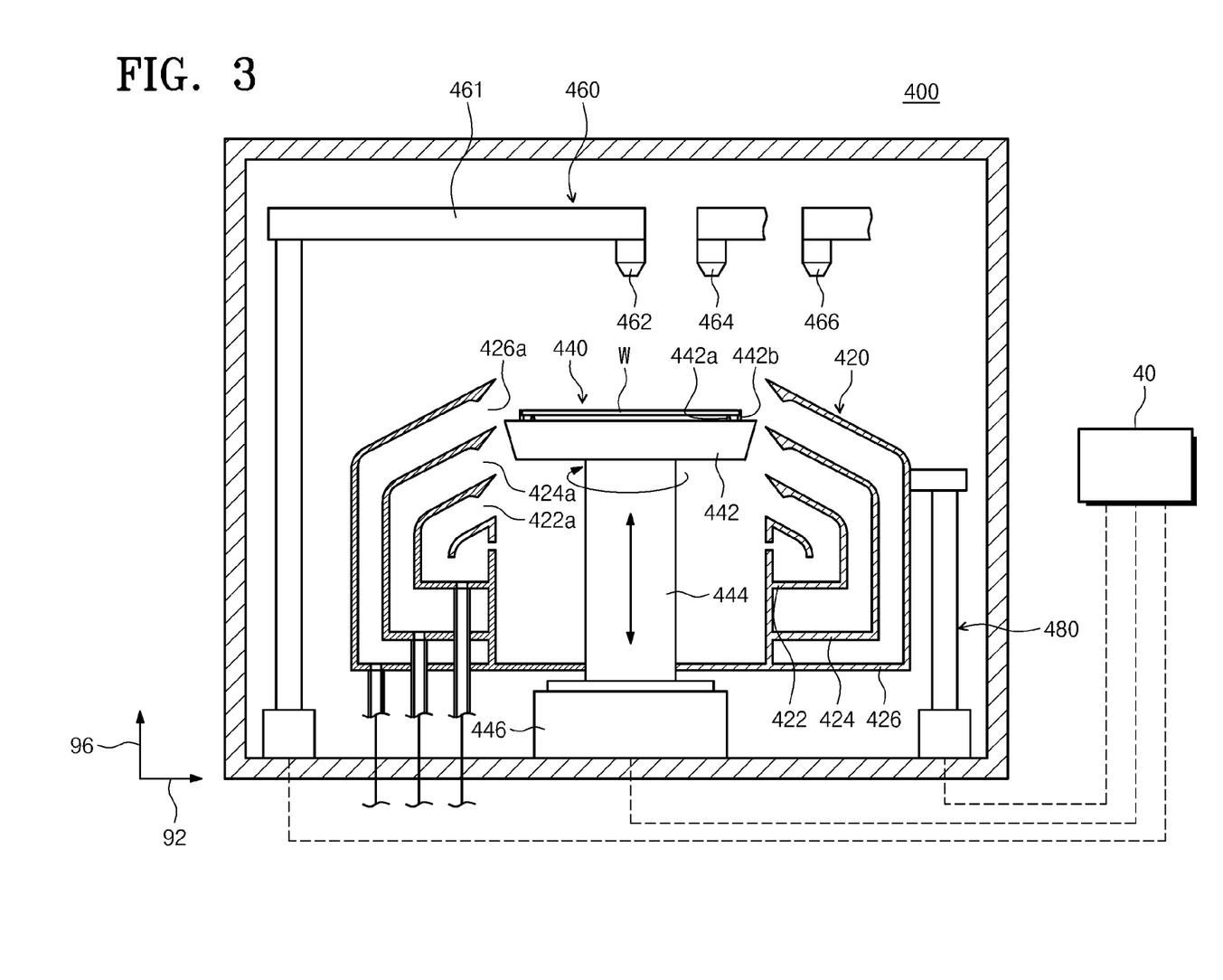
FIG. 3 is a schematic view illustrating an embodiment of a liquid treating chamber of FIG. 2.

FIG. 3 is a schematic view illustrating an embodiment of the liquid treating chambers 400 of FIG. 2. Referring to FIG. 3, the liquid treating chamber 400 has a housing 410, a cup 420, a support unit 440, a liquid dispensing unit 460, and a lifting unit 480. The housing 410 has a substantially rectangular parallelepiped shape. The cup 420, the support unit 440, and the liquid dispensing unit 460 are arranged in the housing 410.

The cup 420 has a processing space that is open at the top, and a substrate W is treated with liquids in the processing space. The support unit 440 supports the substrate W in the processing space. The liquid dispensing unit 460 dispenses the liquids onto the substrate W supported on the support unit 440. The liquids of different types may be sequentially dispensed onto the substrate W. The lifting unit 480 adjusts the height of the cup 420 relative to the support unit 440.

According to an embodiment, the cup 420 has a plurality of recovery bowls 422, 424, and 426. The recovery bowls 422, 424, and 426 have recovery spaces for recovering the liquids used to treat the substrate W, respectively. Each of the recovery bowls 422, 424, and 426 has a ring shape that surrounds the support unit 440. The treating liquids scattered by rotation of the substrate W during liquid treating processes may be introduced into the recovery spaces through inlets 422a, 424a, and 426a of the respective recovery bowls 422, 424, and 426. According to an embodiment, the cup 420 has the first recovery bowl 422, the second recovery bowl 424, and the third recovery bowl 426. The first recovery bowl 422 is disposed to surround the support unit 440, the second recovery bowl 424 is disposed to surround the first recovery bowl 422, and the third recovery bowl 426 is disposed to surround the second recovery bowl 424. The second inlet 424a through which a liquid is introduced into the second recovery bowl 424 may be located in a higher position than the first inlet 422a through which a liquid is introduced into the first recovery bowl 422, and the third inlet 426a through which a liquid is introduced into the third recovery bowl 426 may be located in a higher position than the second inlet 424a.

The support unit 440 has a support plate 442 and a driving shaft 444. An upper surface of the support plate 442 may have a substantially circular shape and may have a larger diameter than the substrate W. Support pins 442a are provided on the central portion of the support plate 442 to support the backside of the substrate W. The support pins 442a protrude upward from the support plate 442 to allow the substrate W to be spaced apart from the support plate 442 by a predetermined distance. Chuck pins 442b are provided on the edge portion of the support plate 442. The chuck pins 442b protrude upward from the support plate 442 and support the lateral portion of the substrate W to prevent the substrate W from escaping from the support unit 440 when being rotated. The driving shaft 444 is driven by an actuator 446. The driving shaft 444 is connected to the center of a bottom surface of the support plate 442 and rotates the support plate 442 about the central axis thereof.

According to an embodiment, the liquid dispensing unit 460 has a first nozzle 462, a second nozzle 464, and a third nozzle 466. The first nozzle 462 dispenses a first liquid onto the substrate W. The first liquid may be a liquid for removing a film or foreign matter remaining on the substrate W. The second nozzle 464 dispenses a second liquid onto the substrate W. The second liquid may be a liquid for neutralizing the first liquid dispensed onto the substrate W. Furthermore, the second liquid may be a liquid that neutralizes the first liquid and dissolves better in a third liquid than in the first liquid. The third nozzle 466 dispenses the third liquid onto the substrate W. The third liquid may be a liquid that dissolves well in a supercritical fluid used in the high-pressure chambers 500. For example, the third liquid may be a liquid that dissolves better in the supercritical fluid used in the high-pressure chambers 500 than in the second liquid. The first nozzle 462, the second nozzle 464, and the third nozzle 466 may be supported by different arms 461. The arms 461 may be independently moved. Alternatively, the first nozzle 462, the second nozzle 464, and the third nozzle 466 may be mounted on the same arm and may be simultaneously moved by the same arm.

The lifting unit 480 moves the cup 420 in the vertical direction. The relative height between the cup 420 and the substrate W is modified by the vertical movement of the cup 420. Accordingly, the recovery bowls 422, 424, and 426 for recovering the treating liquids may be changed depending on the types of liquids dispensed onto the substrate W, thereby separately recovering the liquids. In contrast to the above description, the cup 420 may be fixed, and the lifting unit 480 may move the support unit 440 in the vertical direction.

Figure 4:
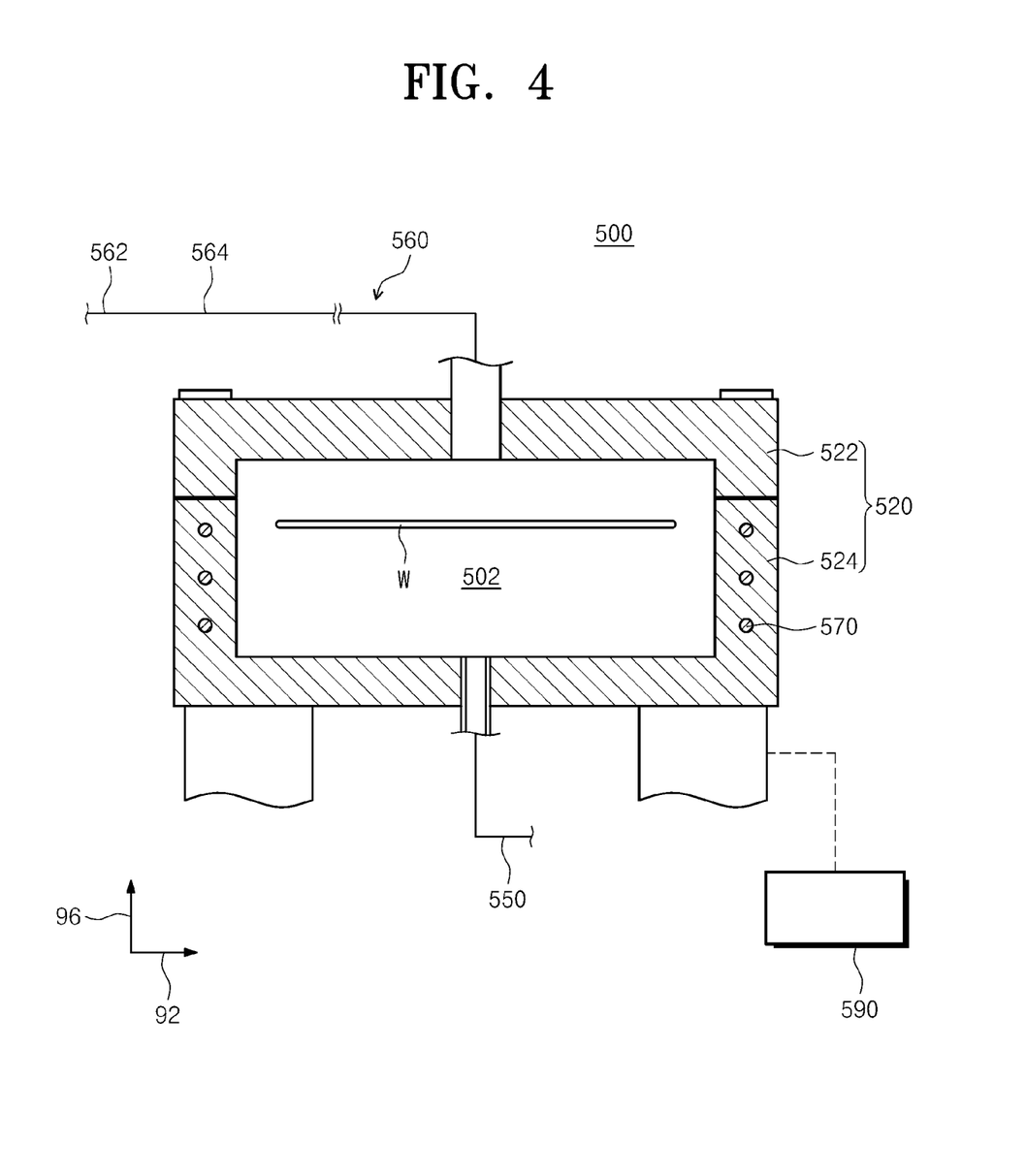
FIG. 4 is a schematic view illustrating an embodiment of a high-pressure chamber of FIG. 2.

FIG. 4 is a schematic view illustrating an embodiment of the high-pressure chambers 500 of FIG. 2. According to an embodiment, the high-pressure chamber 500 removes a liquid on a substrate W by using a supercritical fluid. The high-pressure chamber 500 has a body 520, a substrate support unit (not illustrated), a fluid supply unit 560, and a blocking plate (not illustrated).

The body 520 has an inner space 502 in which a dry process is performed. The body 520 has an upper body 522 and a lower body 524. The upper body 522 and the lower body 524 are combined with each other to form the aforementioned inner space 502. The upper body 522 is located over the lower body 524. The upper body 522 may be fixed in position, and the lower body 524 may be raised or lowered by an actuator 590 such as a cylinder. When the lower body 524 is separated from the upper body 522, the inner space 502 is opened, and the substrate W is placed in or extracted from the inner space 502. During the drying process, the lower body 524 is brought into close contact with the upper body 522 to seal the inner space 502 from the outside. The high-pressure chamber 500 has a heater 570. According to an embodiment, the heater 570 is located in a wall of the body 520. The heater 570 heats the inner space 502 of the body 520 to allow the fluid supplied into the inner space 502 of the body 520 to be maintained in a supercritical state.

Meanwhile, although not illustrated in the drawing, the substrate support unit (not illustrated) that supports the substrate W may be provided in the processing space 502. The substrate support unit (not illustrated) supports the substrate W in the inner space 502 of the body 520. The substrate support unit (not illustrated) may be installed on the lower body 524 to support the substrate W. In this case, the substrate support unit (not illustrated) may raise and support the substrate W. Alternatively, the substrate support unit (not illustrated) may be installed on the upper body 522 to support the substrate W. In this case, the substrate W may be suspended from the substrate support unit (not illustrated) and supported thereby.

The fluid supply unit 560 supplies a treating fluid into the inner space 502 of the body 520. According to an embodiment, the treating fluid in a supercritical state may be supplied into the inner space 502. Alternatively, the treating fluid in a gaseous state may be supplied into the inner space 502 and may experience a phase change into a supercritical state in the inner space 502. The treating fluid may be a fluid for drying.

According to an embodiment, the fluid supply unit 560 has a supply line 562. The supply line 562 supplies the treating fluid from above the substrate W placed on the substrate support unit (not illustrated). According to an embodiment, the supply line 562 is connected to the upper body 522. In addition, the supply line 562 may be connected to the center of the upper body 522.

Alternatively, the supply line 562 may be split into an upper branch line 564 connected to the upper body 522 and a lower branch line (not illustrated). The lower branch line (not illustrated) may be connected to the lower body 524. The upper branch line 564 and the lower branch line (not illustrated) may each have a flow valve installed therein.

An exhaust line 550 is connected to the lower body 524. The supercritical fluid in the inner space 502 of the body 520 is discharged outside the body 520 through the exhaust line 550.

In the case where the lower branch line (not illustrated) is connected to the lower body 524, the blocking plate (not illustrated) may be disposed in the inner space 502 of the body 520. The blocking plate (not illustrated) may have a circular plate shape. The blocking plate (not illustrated) is supported by supports (not illustrated) so as to be spaced apart upward from a bottom surface of the body 520. The supports (not illustrated) have a rod shape and are spaced apart from each other by a predetermined distance. An outlet of the lower branch line (not illustrated) and an inlet of the exhaust line 550 may be provided in positions that do not interfere with each other. The blocking plate (not illustrated) may prevent the treating fluid supplied through the lower branch line (not illustrated) from being directly dispensed toward the substrate W to damage the substrate W.

Figure 5:
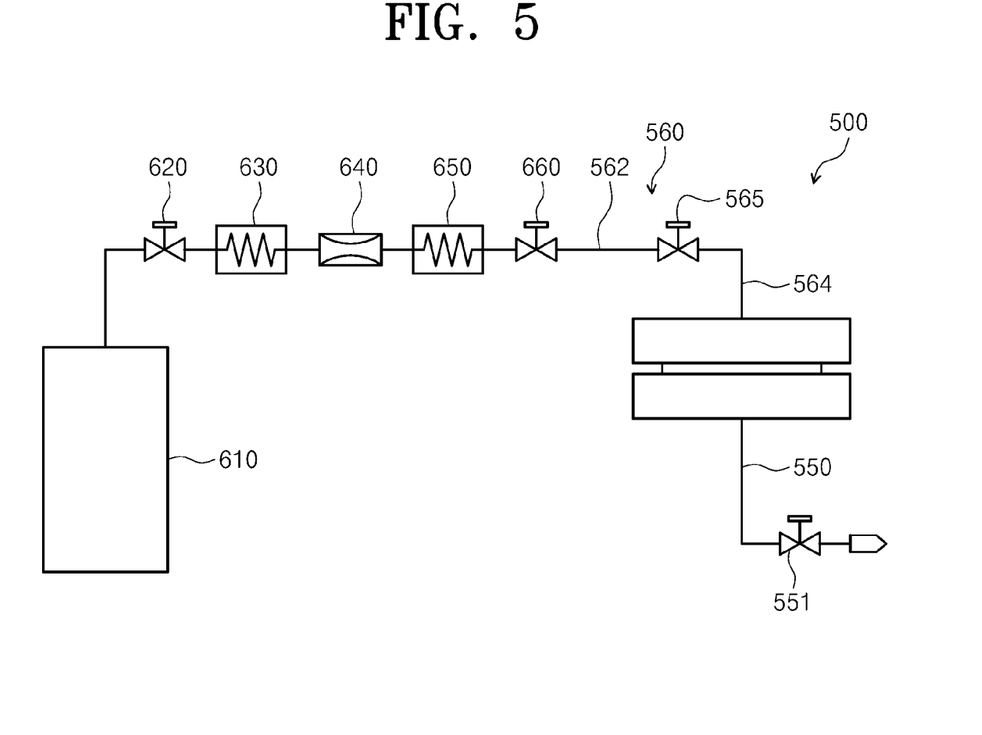
FIG. 5 is a schematic view illustrating a substrate treating apparatus according to an embodiment of the inventive concept.

FIG. 5 is a schematic view illustrating a substrate treating apparatus according to an embodiment of the inventive concept. The fluid supply unit 560 will be described in detail with reference to FIG. 5.

According to an embodiment, a fluid supply tank 610 is provided upstream of the fluid supply unit 560. The fluid supply tank 610 stores a treating fluid that is to be supplied into the high-pressure chamber 500. According to an embodiment, the treating fluid is carbon dioxide. The supply line 562 is connected to the fluid supply tank 610. The supply line 562 provides a passage through which the treating fluid stored in the fluid supply tank 610 is supplied into the high-pressure chamber 500.

According to an embodiment, the supply line 562 is equipped with a flow valve 620, a first heater 630, an orifice 640, a second heater 650, and a flow valve 660. According to an embodiment, the flow valve 620, the first heater 630, the orifice 640, the second heater 650, and the flow valve 660 are sequentially arranged from an upstream side to a downstream side. The terms "upstream side" and "downstream side" used herein are based on the flow direction of the treating fluid in the supply line 562.

The flow valve 620 is a valve that opens or closes the supply of the treating fluid from the fluid supply tank 610. In an open state, the flow valve 620 allows the treating fluid to flow through the supply line 562 downstream of the flow valve 620. In a closed state, the flow valve 620 does not allow the treating fluid to flow through the supply line 562 downstream of the flow valve 620. The treating fluid passing through the flow valve 620 is in a high-temperature gaseous state or a supercritical state. A plurality of flow valves 620 may be installed for each line to control the supply of the treating fluid.

The orifice 640 regulates the amount of treating fluid supplied from the fluid supply tank 610. The amount of treating fluid passing through the orifice 640 is adjusted depending on the size of orifice 640. The orifice 640 changes the cross-section of the flow passage in the line. The cross-sectional area of the flow passage in the orifice 640 is gradually decreased from the upstream side to the downstream side. According to an embodiment, the flow passage in the orifice 640 comprises a section having a decreasing cross-sectional area from the upstream side to the downstream side, a section having a constant cross-sectional area, and a section having an increasing cross-sectional area from the upstream side to the downstream side.

The first heater 630 is provided upstream of the orifice 640. The first heater 630 heats the treating fluid upstream of the orifice 640 to a set temperature or more.

The second heater 650 is provided downstream of the orifice 640. The second heater 650 heats the treating fluid downstream of the orifice 640 to the set temperature or more. According to an embodiment, the second heater 650 is for maintaining the temperature of the treating fluid.

Figure 6:
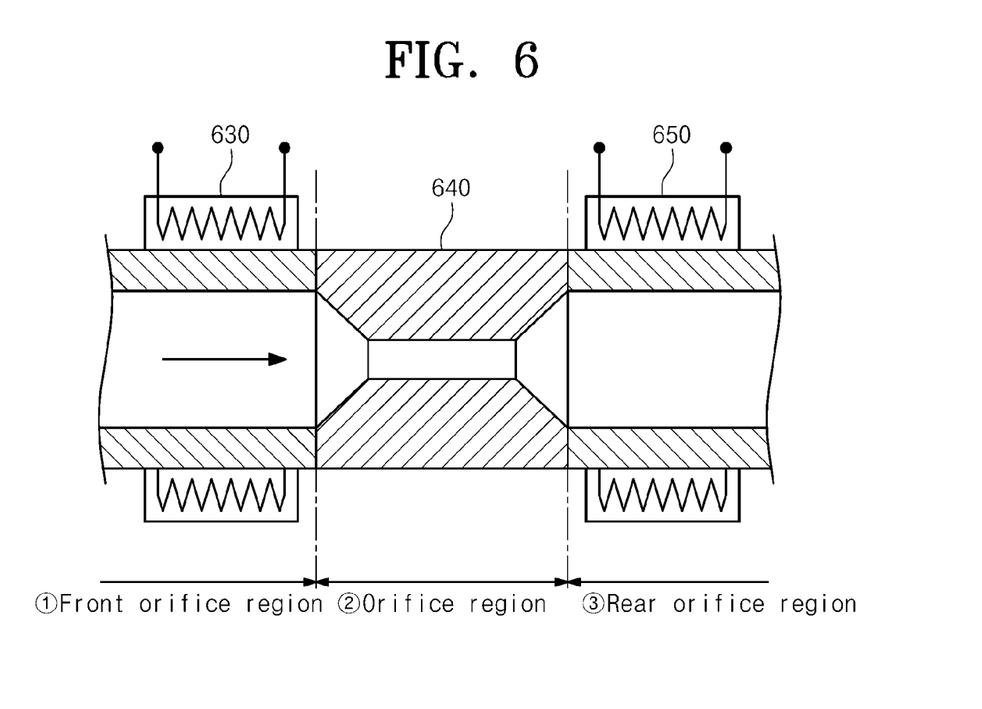
FIG. 6 is an enlarged view illustrating an orifice region and neighboring regions in FIG. 5.
Figure 7:
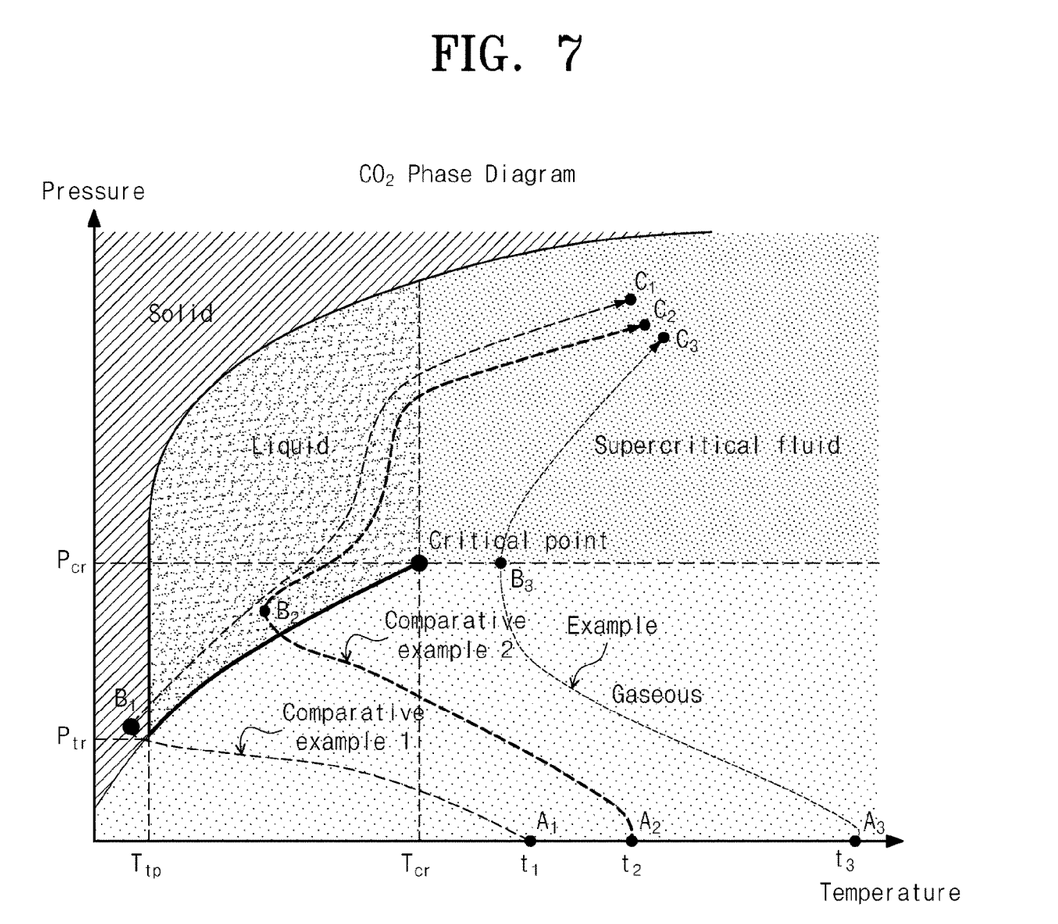
FIG. 7 illustrates the phase diagram of carbon dioxide in which a phase change process according to an example of the inventive concept is represented.

FIG. 6 is an enlarged view illustrating an orifice region and neighboring regions in FIG. 5, and FIG. 7 illustrates the phase diagram of carbon dioxide in which a phase change process according to an example of the inventive concept is represented.

Referring to FIGS. 6 and 7, a front orifice region ① is provided upstream of the orifice region ② in which the orifice 640 is provided, and a rear orifice region ③ is provided downstream of the orifice region ④. The first heater 630 is installed in the front orifice region, and the second heater 650 is installed in the rear orifice region.

In FIG. 7, $T_{cr}$ is the temperature at the critical point, $T_{tp}$ is the temperature at the triple point, $P_{cr}$ is the pressure at the critical point, and $P_{tr}$ is the pressure at the triple point. For example, in the case where the treating fluid is carbon dioxide, $T_{cr}$ is 31.1° C., $T_{tp}$ is −56.4° C., $P_{cr}$ is 73 atm, and $P_{tr}$ is 5.11 atm.

The treating fluid at $T_cr$ or more that passes through the orifice 640 is adiabatically expanded downstream of the orifice 640. At this time, the temperature of the treating fluid sharply drops along the direction A→B of FIG. 7. Thereafter, as the second heater 650 heats the treating fluid, the temperature of the treating fluid rises along the direction B→C.

In comparative example 1, a treating fluid in a gaseous state at point A1 of a specific temperature ($T_cr$ or more) and a specific pressure on the temperature-pressure phase diagram is adiabatically expanded after passing through the orifice 640. At this time, the temperature of the treating fluid drops along the direction A1→B1. The treating fluid, the temperature of which is lowered, exists in a solid state at turning point B1. Thereafter, as the second heater 650 downstream of the orifice 640 heats the treating fluid, the treating fluid goes to a supercritical fluid phase through a liquid phase along the direction B1→C1. According to comparative example 1, the treating fluid experiences the four-phase change in the process of sequentially passing through points A1, B1, and C1 until the treating fluid is supplied in the supercritical fluid state.

In comparative example 2, a treating fluid in a gaseous state at point A2 of a specific temperature ($T_{cr}$ or more) and a specific pressure (the temperature at point A2 being higher than the temperature at point A1) on the temperature-pressure phase diagram is adiabatically expanded after passing through the orifice 640. At this time, the temperature of the treating fluid drops along the direction A2→B2. The treating fluid, the temperature of which is lowered, exists in a liquid state at turning point B2. Thereafter, as the second heater 650 downstream of the orifice 640 heats the treating fluid, the treating fluid goes to a supercritical fluid phase along the direction B2→C2. According to comparative example 2, the treating fluid experiences the three-phase change in the process of sequentially passing through points A2, B2, and C2 until the treating fluid is supplied in the supercritical fluid state.

In the example of the inventive concept, a treating fluid in a gaseous state at point A3 of a specific temperature ($T_{cr}$ or more) and a specific pressure (the temperature at point A3 being higher than the temperature at point A2) on the temperature-pressure phase diagram is adiabatically expanded after passing through the orifice 640. At this time, the temperature of the treating fluid drops along the direction A3→B3. The treating fluid, the temperature of which is lowered, exists in a gaseous or supercritical state at turning point B3. Thereafter, as the second heater 650 downstream of the orifice 640 heats the treating fluid, the treating fluid goes to a supercritical fluid phase along the direction B3→C3. According to the example of the inventive concept, the treating fluid experiences the two-phase change in the process of sequentially passing through points A3, B3, and C3 until the treating fluid is supplied in the supercritical fluid state.

The treating fluid in comparative example 1 experiences the four-phase change, and the treating fluid in comparative example 2 experiences the three-phase change. The phase changes of the treating fluids cause a rise in the level of contamination in the treating fluids. For example, when the treating fluid at point B1 in comparative example 1 is solid, the solid may strike the pipe of the supply line 562 to cause contamination.

To minimize a phase change, a method of storing a supercritical fluid in the fluid supply tank 610 and thereafter supplying the supercritical fluid or a method of raising the temperature of a treating fluid in the fluid supply tank 610 to the maximum may be used. However, these methods may cause a decrease in the capacity of a treating fluid that can be stored in the fluid supply tank 610.

On the supply line 562 according to the embodiment, the first heater 630 is provided upstream of the orifice 640 where adiabatic expansion occurs. The first heater 630 heats the supercritical fluid to the set temperature or more immediately before the treating fluid passes through the orifice 640. The set temperature is a range of temperature that allows the temperature of the supercritical fluid expanded after passing through the orifice 640 to be maintained at the critical temperature or more.

The first heater 630 may not only previously raise the temperature of the treating fluid, the temperature of which is lowered after the passage of the treating fluid through the orifice 640, but may also increase the capacity of a treating fluid that can be stored in the fluid supply tank 610.

Figure 8:
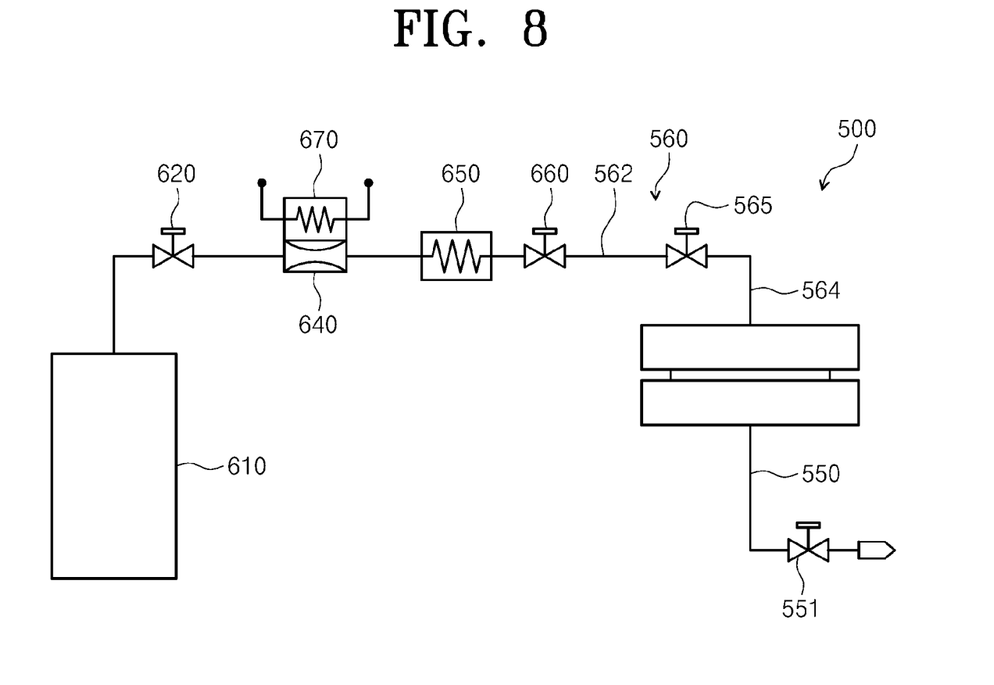
FIG. 8 is a schematic view illustrating a substrate treating apparatus according to another embodiment of the inventive concept.

FIG. 8 is a schematic view illustrating a substrate treating apparatus according to another embodiment of the inventive concept. Referring to FIG. 8, a third heater 670 may be provided on the orifice 640. The third heater 670 heats the treating fluid to allow the temperature of the treating fluid passing through the orifice 640 to be maintained at the critical temperature or more.

Figure 9:
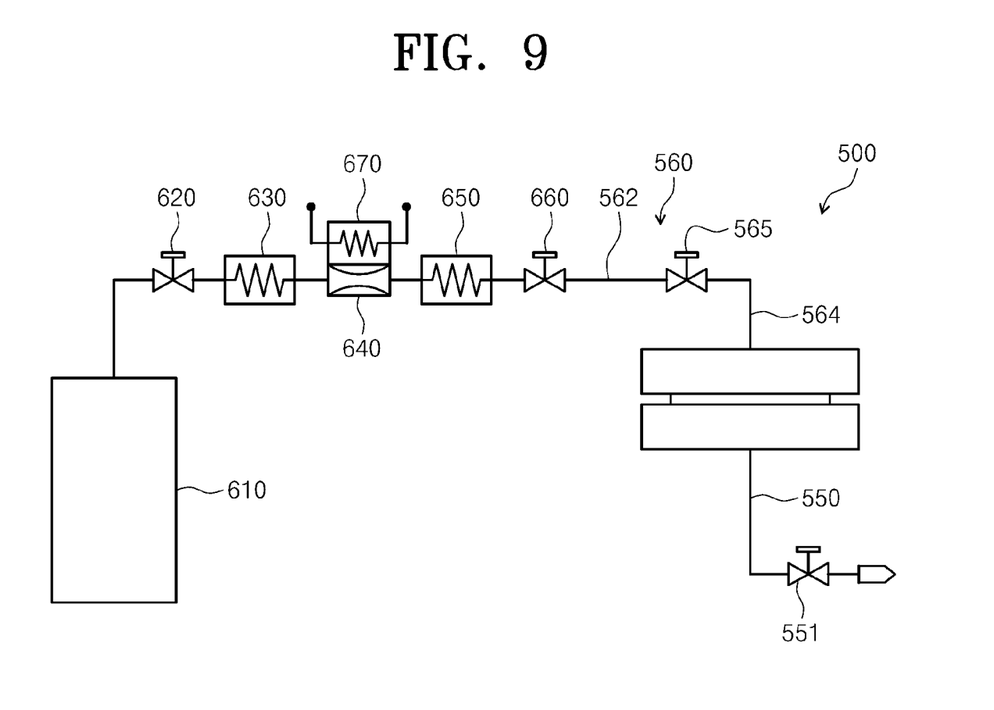
FIG. 9 is a schematic view illustrating a substrate treating apparatus according to another embodiment of the inventive concept.

FIG. 9 is a schematic view illustrating a substrate treating apparatus according to another embodiment of the inventive concept. Referring to FIG. 9, the embodiment illustrated in FIG. 5 and the embodiment illustrated in FIG. 8 may be merged together. The first heater 630 may be provided upstream of the orifice 640, and the third heater 670 may be provided on the orifice 640.

The inventive concept may be applied not only to a process of drying a substrate by using a supercritical fluid but also to a process of treating a substrate by using a supercritical fluid, and this corresponds to a modification of an ordinary creativity range.

According to the embodiments of the inventive concept, the substrate treating apparatus and method may improve process efficiency when treating a substrate by using a supercritical fluid.

Further, according to the embodiments of the inventive concept, the substrate treating apparatus and method may reduce particles on a substrate when treating the substrate by using a supercritical fluid.

Effects of the inventive concept are not limited to the above-described effects, and any other effects not mentioned herein may be clearly understood from this specification and the accompanying drawings by those skilled in the art to which the inventive concept pertains.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for treating a substrate, the method comprising:
    performing a process of treating the substrate by dispensing a supercritical fluid onto the substrate,
    wherein a treating fluid flows through a treating fluid supplying regulator regulating an amount of the treating fluid before dispensed onto the substrate, and
    wherein the treating fluid is heated to a set temperature or more by a first heater before passing through the treating fluid supplying regulator, and the treating fluid is heated by a second heater when the treating fluid is passed through the treating fluid supplying regulator;
    wherein the temperature of the treating fluid is lowered in a rear region of the treating fluid supplying regulator;
    wherein the set temperature is a temperature that allows the lowered temperature to be maintained at a critical temperature or more;
    wherein the treating fluid supplying regulator includes:
    a flow passage having a section having a decreasing cross-sectional area from the upstream side to the downstream side, a section having a constant cross-sectional area, and a section having an increasing cross-sectional area from the upstream side to the downstream side,
    wherein the second heater is provided on the treating fluid supplying regulator.

2. The method of claim 1, wherein the treating fluid supplying regulator configured to supply the treating fluid further comprises:
    a front region upstream of the treating fluid supplying regulator; and
    a rear region downstream of the treating fluid supplying regulator, wherein the treating fluid forms at least one turning point in a temperature-pressure phase diagram while sequentially passing through the front region, and the rear region, and wherein the turning point is formed at a temperature higher than a critical temperature of the treating fluid.

3. The method of claim 1, wherein the process is a process of drying the substrate.

4. The method of claim 1, wherein the treating fluid is carbon dioxide.

5. A method for treating a substrate, the method comprising:

performing a process of treating the substrate by dispensing a supercritical fluid onto the substrate, wherein a treating fluid flows through a treating fluid supplying regulator regulating an amount of the treating fluid before dispensed onto the substrate, wherein a flow passage in the treating fluid supplying regulator comprises at least one of a section having a decreasing cross-sectional area from the upstream side to the downstream side, a section having a constant cross-sectional area, and a section having an increasing cross-sectional area from the upstream side to the downstream side, wherein the treating fluid is heated to a set temperature or more by a first heater as passing through the treating fluid supplying regulator, and the treating fluid is heated by a second heater after passing through the treating fluid supplying regulator, wherein the temperature of the treating fluid is lowered in rear region of the treating fluid supplying regulator, and wherein the set temperature is a temperature that allows the lowered temperature to be maintained at a critical temperature or more, wherein the first heater is provided on the treating fluid supplying regulator.

6. A method for treating a substrate, the method comprising:

performing a process of treating the substrate by dispensing a supercritical fluid onto the substrate, wherein a treating fluid flows through a treating fluid supplying regulator regulating an amount of the treating fluid before dispensed onto the substrate, and wherein the treating fluid is heated to a set temperature or more by a first heater before passing through the treating fluid supplying regulator, the treating fluid is heated by a second heater after passing through the treating fluid supplying regulator, and the treating fluid is heated by a third heater when the treating fluid is passed through the treating fluid supplying regulator;

wherein the temperature of the treating fluid is lowered in a rear region of the treating fluid supplying regulator;

wherein the set temperature is a temperature that allows the lowered temperature to be maintained at a critical temperature or more;

wherein the treating fluid supplying regulator includes:

a flow passage having a section having a decreasing cross-sectional area from the upstream side to the downstream side, a section having a constant cross-sectional area, and a section having an increasing cross-sectional area from the upstream side to the downstream side, wherein the third heater is provided on the treating fluid supplying regulator.

* * * * *